United States Patent
Wu et al.

(10) Patent No.: US 7,642,133 B2
(45) Date of Patent: Jan. 5, 2010

(54) METHOD OF MAKING A SEMICONDUCTOR PACKAGE AND METHOD OF MAKING A SEMICONDUCTOR DEVICE

(75) Inventors: Yen-Yi Wu, Kao-Hsiung (TW); Wei-Yueh Sung, Ping-Tung (TW); Pao-Huei Chang Chien, Kaohsiung County (TW); Chi-Chih Chu, Kao-Hsiung (TW); Cheng-Yin Lee, Tai-Nan (TW); Gwo-Liang Weng, Kao-Hsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 7 days.

(21) Appl. No.: 11/828,352

(22) Filed: Jul. 26, 2007

(65) Prior Publication Data

US 2008/0076208 A1    Mar. 27, 2008

(30) Foreign Application Priority Data

Sep. 27, 2006   (TW)   .............................. 95135866 A

(51) Int. Cl.
*H01L 21/00*   (2006.01)
*H01L 21/44*   (2006.01)
*H01L 23/02*   (2006.01)

(52) U.S. Cl. ........................ 438/109; 438/613; 257/686; 257/E23.069

(58) Field of Classification Search ................. 438/109; 257/686
See application file for complete search history.

(56) References Cited

U.S. PATENT DOCUMENTS

| | | | |
|---|---|---|---|
| 5,861,666 A | 1/1999 | Bellaar | |
| 5,892,290 A | 4/1999 | Chakravorty et al. | |
| 5,985,695 A | 11/1999 | Freyman et al. | |
| 6,195,268 B1 | 2/2001 | Eide | |
| 6,489,676 B2 | 12/2002 | Taniguchi et al. | |
| 6,740,546 B2 | 5/2004 | Corisis et al. | |
| 6,740,964 B2 | 5/2004 | Sasaki | |
| 6,815,254 B2 | 11/2004 | Mistry et al. | |
| 6,847,109 B2 | 1/2005 | Shim | |
| 6,924,550 B2 | 8/2005 | Corisis et al. | |

(Continued)

FOREIGN PATENT DOCUMENTS

JP    2000-294720    10/2000

(Continued)

*Primary Examiner*—Ha Tran T Nguyen
*Assistant Examiner*—Valerie Brown
(74) *Attorney, Agent, or Firm*—Cooley Godward Kronish LLP

(57) ABSTRACT

The present invention relates to a semiconductor package and a semiconductor device and a method of making the same. The method of making the semiconductor package comprises: providing a substrate; attaching a chip to a surface of the substrate; forming a plurality of connecting elements for electrically connecting the chip and the substrate; forming a plurality of first conductive bodies on the surface of the substrate; forming a molding compound for encapsulating the surface of the substrate, the chip, the connecting elements and the first conductive bodies; and removing a part of a border portion of the molding compound, so that the molding compound has two heights and one end of each first conductive bodies is exposed. Thereby, the molding compound covers the entire surface of the substrate, so that the bonding pads on the surface of the substrate will not be polluted.

25 Claims, 8 Drawing Sheets

U.S. PATENT DOCUMENTS

| | | |
|---|---|---|
| 7,185,426 B1 | 3/2007 | Hiner et al. |
| 7,187,068 B2 | 3/2007 | Suh et al. |
| 7,262,080 B2 | 8/2007 | Go et al. |
| 7,436,074 B2 | 10/2008 | Pan et al. |
| 2005/0117835 A1 | 6/2005 | Nguyen et al. |
| 2005/0121764 A1* | 6/2005 | Mallik et al. ................ 257/686 |
| 2007/0273049 A1 | 11/2007 | Khan et al. |
| 2007/0290376 A1 | 12/2007 | Zhao et al. |

FOREIGN PATENT DOCUMENTS

| | | |
|---|---|---|
| TW | 200611305 | 4/2006 |

* cited by examiner

METHOD OF MAKING A SEMICONDUCTOR PACKAGE AND METHOD OF MAKING A SEMICONDUCTOR DEVICE

BACKGROUND OF THE INVENTION

1. Field of the Invention

The present invention relates to a semiconductor package and a method of making the same, and particularly to a semiconductor package comprising a molding compound with different heights and a semiconductor device comprising the semiconductor package and methods of making the same.

2. Description of the Prior Art

Please refer to FIG. 1 showing a schematic diagram of a conventional semiconductor device consisting of stacked packages. The conventional semiconductor device 1 comprises a first package 10 and a second package 20. The first package 10 comprises a first substrate 11, a first chip 12, a plurality of first conductive wires 13, a first molding compound 14, and a plurality of first solder balls 15. The first substrate 11 has an upper surface 111, a lower surface 112, and a plurality of first pads 113. The first pads 113 are disposed on the upper surface 111 of the first substrate 11. The first chip 12 is adhered to the upper surface 111 of the first substrate 11 and electrically connected to the upper surface 111 of the first substrate 11 by the first conductive wires 13. The first molding compound 14 encapsulates the first chip 12, the first conductive wires 13, and a part of the upper surface 111 of the first substrate 11, and the first pads 113 are exposed. The first solder balls 15 are on the lower surface 112 of the first substrate 11.

The second package 20 is stacked on the first package 10. The second package 20 comprises a second substrate 21, a second chip 22, a plurality of second conductive wires 23, a second molding compound 24, and a plurality of second solder balls 25. The second substrate 21 has an upper surface 211, a lower surface 212, and a plurality of second pads 213. The second pads 213 are disposed on the lower surface 212 of the second substrate 21. The second chip 22 is adhered to the upper surface 211 of the second substrate 21 and electrically connected to the upper surface 211 of the second substrate 21 by the second conductive wires 23. The second molding compound 24 encapsulates the second chip 22, the second conductive wires 23, and the upper surface 211 of the second substrate 21. The upper ends of the second solder balls 25 are connected to the second pads 213 on the lower surface 212 of the second substrate 21, and the lower ends are connected to the first pads 113 on the upper surface 111 of the first substrate 11.

One of the drawbacks of the conventional semiconductor device 1 is that the area encapsulated by the first molding compound 14 in the first package 10 is smaller than that encapsulated by the second molding compound 24 in the second package 20. As a result, two different molds are required in the molding processes for the first package 10 and the second package 20. The cost is high for making a mold. Molds of different sizes are often needed for molding processes to make different package devices. Accordingly, the production cost will be dramatically increased. Moreover, in the first package 10, there is an included angle of about 60 degrees between the sidewall of the first molding compound 14 and the first substrate 11. The included angle is namely the draft angle of the mold. Furthermore, the top surface of the first molding compound 14 has a mold insert gate mark. In addition, in the molding process for the first package 10, the first molding compound 14 tends to overflow onto the upper surface 111 of the first substrate 11 to pollute the first pads 113.

Therefore, it is necessary to provide a novel and progressive semiconductor package and semiconductor device and method of making the same to solve the aforesaid problems.

SUMMARY OF THE INVENTION

One main objective of the present invention is to provide a method of making a semiconductor package comprising the following steps of: providing a first substrate having a first surface and a second surface; attaching a first chip to the first surface of the first substrate; forming a plurality of first connecting elements for electrically connecting the first chip and the first substrate; forming a plurality of first conductive bodies on the first surface of the first substrate; forming a first molding compound for encapsulating the first surface of the first substrate, the first chip, the first connecting elements, and the first conductive bodies; and removing a part of a border portion of the first molding compound, so that the first molding compound has at least two heights and one end of each of the first conductive bodies is exposed.

Another objective of the present invention is to provide a semiconductor package, which comprises a substrate, a chip, a plurality of connecting elements, a plurality of first conductive bodies, and a molding compound. The substrate has a first surface and a second surface. The chip is attached to the first surface of the substrate. The connecting elements electrically connect the chip and the substrate. The first conductive bodies are disposed on the first surface of the substrate. The molding compound encapsulates the first surface of the substrate, the chip, the connecting elements, and the first conductive bodies. The molding compound has at least two heights and one end of each of the first conductive bodies is exposed. Thereby, the molding compound encapsulates the entire first surface of the substrate, and the pads on the first surface will not be polluted.

Still another objective of the present invention is to provide a semiconductor device, which comprises a first package and a second package. The first package is the semiconductor package as described above. The second package is stacked on the first package. In an embodiment, the size of the second package is the same as that of the first package. Thus, only one mold is required to perform both the molding processes for the second package and the first package. Accordingly, the production cost will be reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
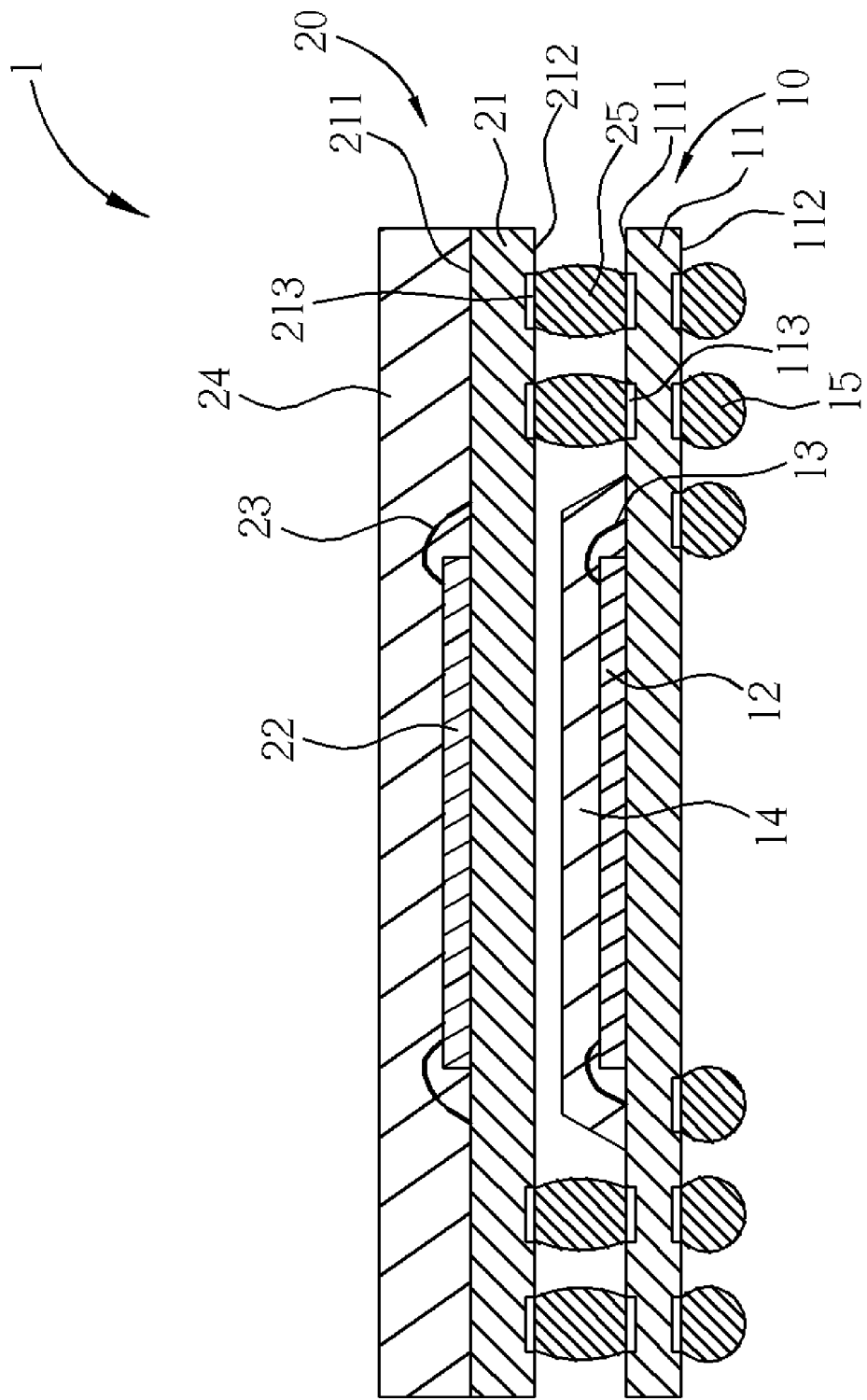
FIG. 1 shows a schematic diagram of a conventional semiconductor device consisting of stacked packages.
Figure 2:
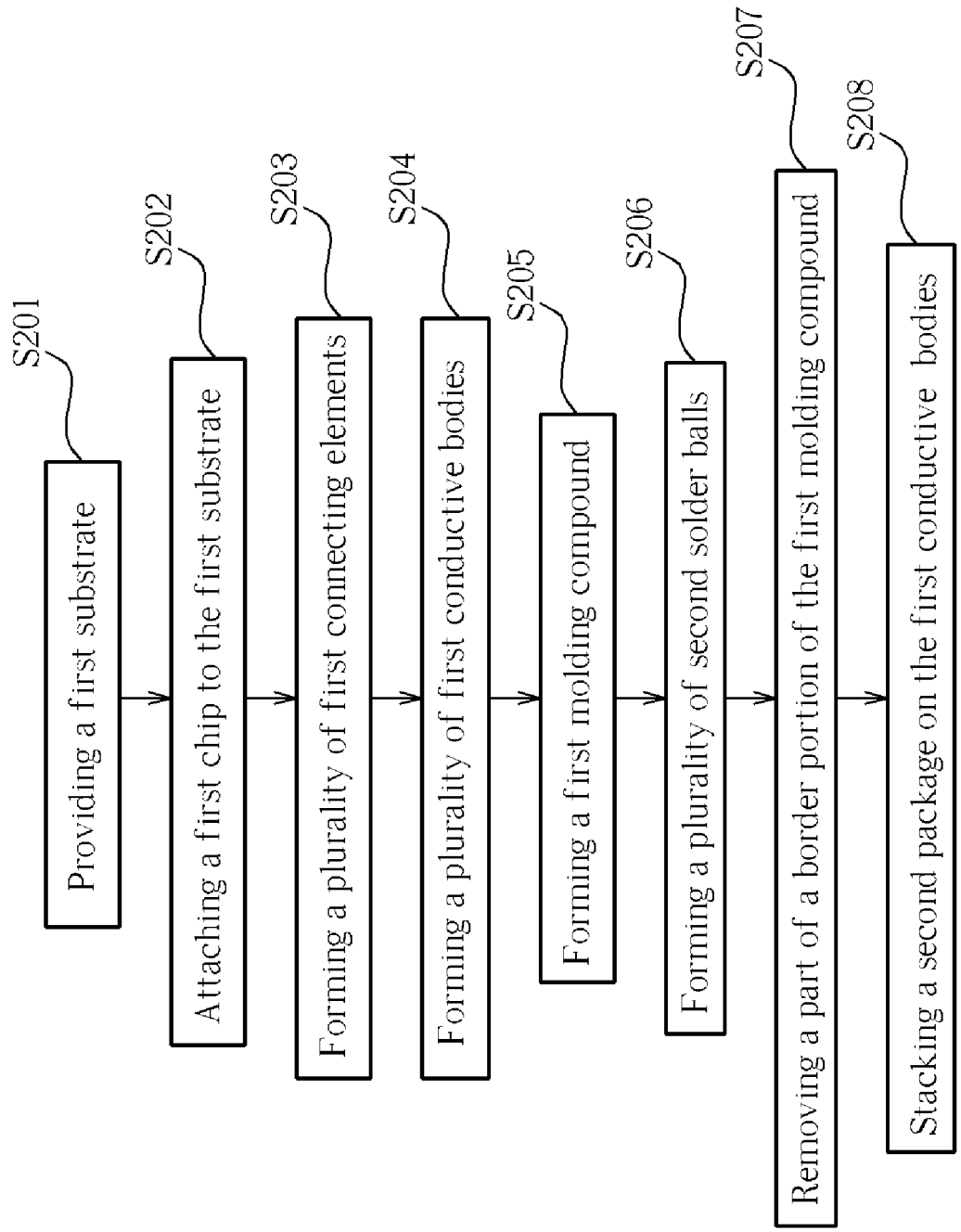
FIG. 2 shows a flow chart of the method of making a semiconductor device according to the present invention.
Figure 3:
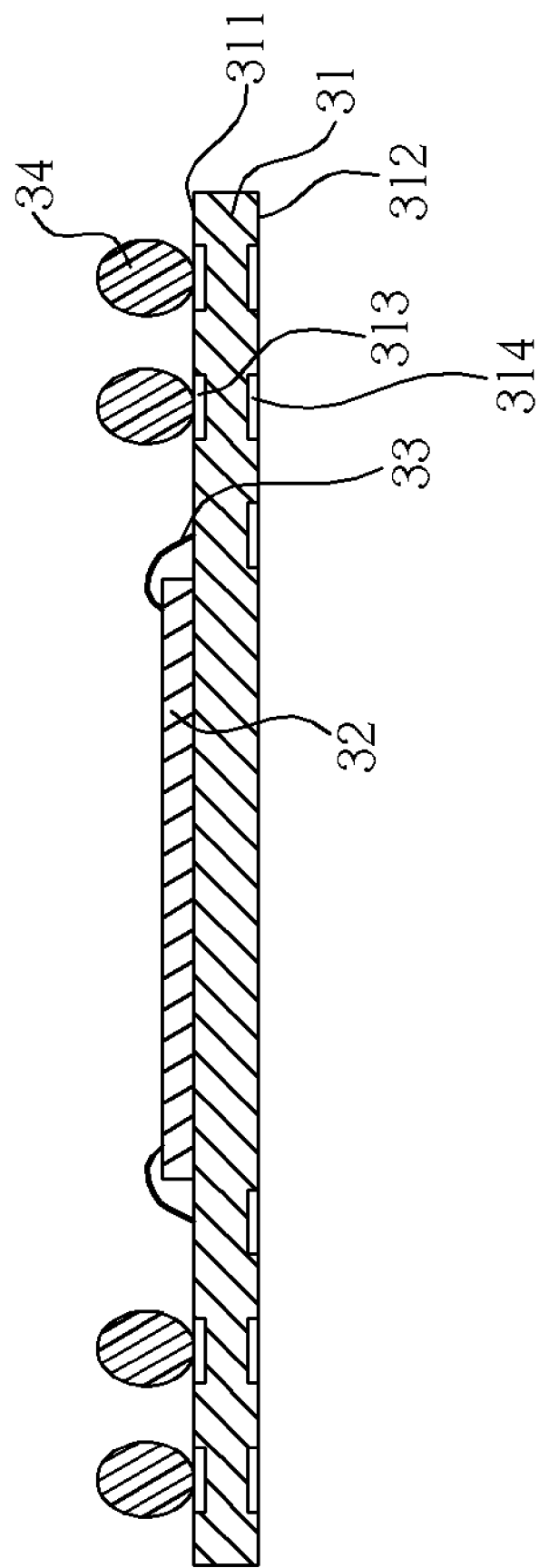
FIGS. 3 to 8 show schematic step by step diagrams illustrating the method of making a semiconductor device according to the present invention.

Please refer to FIG. 2 showing a flow chart of the method of making a semiconductor device according to the present invention. Also refer to FIG. 3. In Step S201, a first substrate 31 is provided. The first substrate 31 has a first surface 311, a second surface 312, a plurality of first pads 313, and a plurality of second pads 314. The first pads 313 are on the first surface 311, and the second pads 314 are on the second surface 312. In Step S202, a first chip 32 is attached to the first surface 311 of the first substrate 31. In this embodiment, a first chip 32 is attached to the first surface 311 of the first substrate 31. In Step S203, a plurality of first connecting elements (such as a plurality of first conductive wires 33) electrically connect the first chip 32 and the first surface 311 of the first substrate 31. In Step 204, a plurality of first conductive bodies (such as a plurality of first solder balls 34) are formed on the first pads 313 on the first surface 311 of the first substrate 31. In this embodiment, the first conductive bodies may be solder balls; however, it may be realized that the first conductive bodies can be solder bumps, gold stud bumps, or metal pins and each in a shape of pillar or column, in addition to a shape of ball.

It should be noted that, in other applications, after Step S201 is performed, Step S204 is performed and followed by Step S202 and Step S203. That is, the first conductive bodies (such as the first solder balls) may be formed on the first pads 313 on the first surface 311 of the first substrate 31 before the first chip 32 is attached to the first surface 311 of the first substrate 31. Thereafter, the first conductive elements (such as the first conductive wires 33) are formed for electrically connecting the first chip 32 and the first surface 311 of the first substrate 31.

Figure 4:
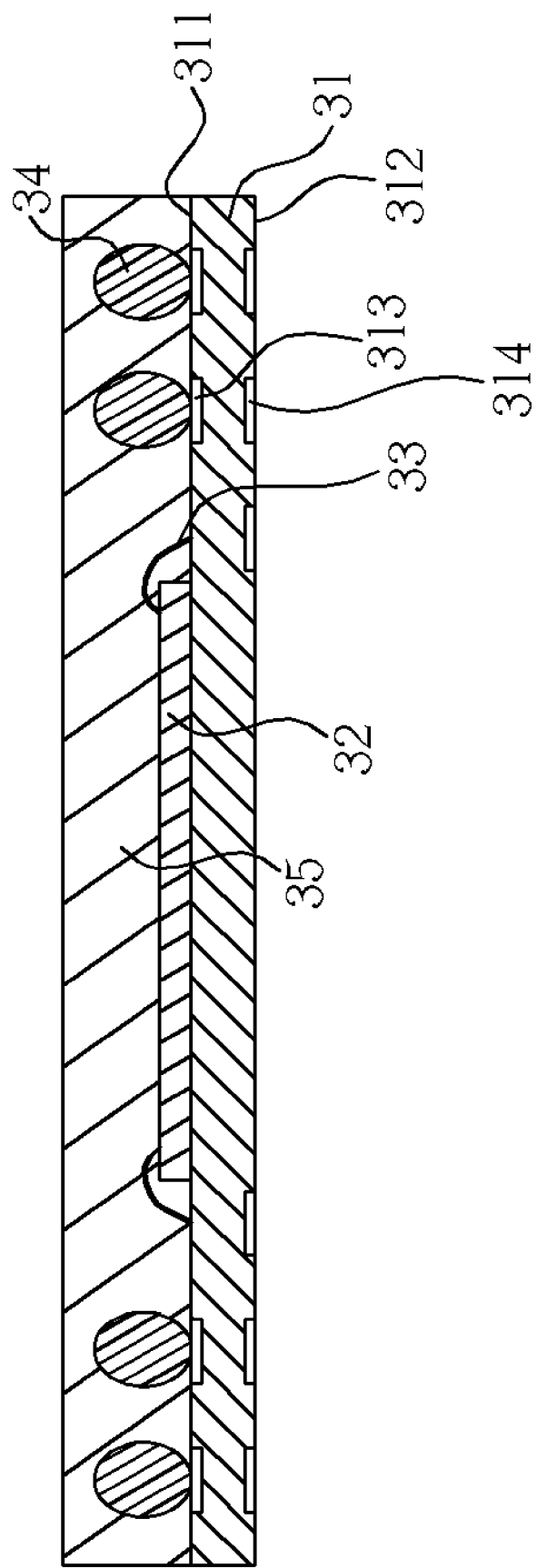

Please refer to FIG. 2 and FIG. 4. In Step S205, a first molding compound 35 for encapsulating the first surface 311 of the first substrate 31, the first chip 32, the first conductive wires 33, and the first solder balls 34. It should be noted that the first molding compound 35 encapsulates the entire first surface 311 of the first substrate 31. In this embodiment, the top surface of the first molding compound 35 is higher than the top of the first solder balls 34; however, it may be realized that the top surface of the first molding compound 35 can be at the same height with the top of the first solder balls 34, or the top surface of the first molding compound 35 can be lower than the top of the first solder balls 34.

The included angle between the sidewall of the first molding compound 35 and the first substrate 31 is about 85 to 95 degrees, and preferably 90 degrees, because the draft angle is almost not needed for the mold in the present invention. Furthermore, in the present invention, a plurality of the first chips 32 may be encapsulated with the first molding compound 35 and thereafter divided into a plurality of packages having a shape like tofu. Thereby, the top surface of the first molding compound 35 in the packages will not have a mold insert gate mark.

Figure 5:
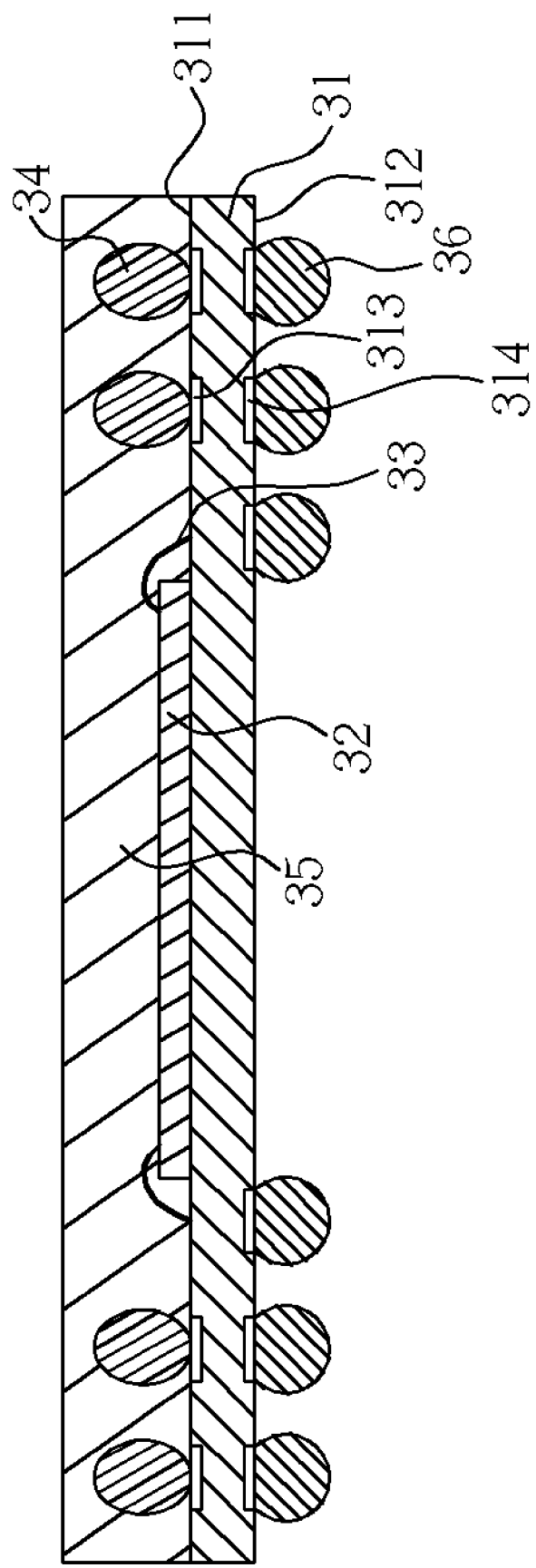

Please refer to FIG. 2 and FIG. 5. In Step S206, a plurality of second solder balls 36 are formed on the second pads 314 on the second surface 312 of the first substrate 31. It should be noted that this step is an optional step.

Figure 6:
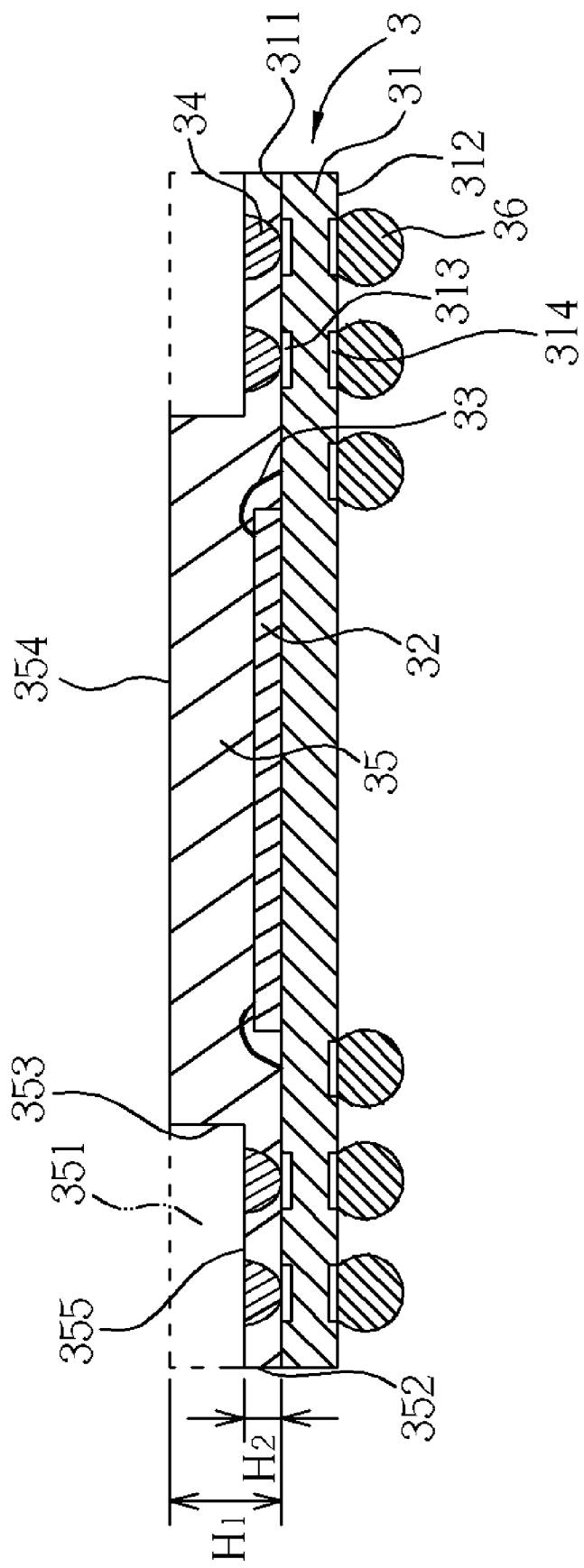

Please refer to FIG. 2 and FIG. 6. In Step S207, a part of a border portion of the first molding compound 35 is removed, so that the first molding compound 35 has at least two heights and one end of each of the first solder balls 34 is exposed to make a first package 3. The removal in this step may be accomplished by laser cutting, chemical etching, cutting with a cutting tool, or cutting with a water jet. In this step of this embodiment, the way of cutting with a cutting tool is used to remove the upper part 351 of the border portion of the first molding compound 35, and the lower part 352 of the border portion is remained. The central portion 353 of the first molding compound 35 is not cut away and is entirely remained.

Therefore, after the cutting, the molding compound 35 has a first height $H_1$, a second height $H_2$, a central portion 353, a lower part 352 of a border portion, a first top surface 354, and a second top surface 355. The first height $H_1$ is the height of the central portion 353 corresponding to the positions of the first chip 32 and the first conductive wires 33. The second height $H_2$ is the height of the lower part 352 of the border portion corresponding to the positions of the first solder balls 34. The first height $H_1$ is greater than the second height $H_2$. The first top surface 354 is corresponding to the first height $H_1$, that is, the first top surface 354 is the top surface of the central portion 353. The first top surface 354 has a first surface roughness. The second top surface 355 is corresponding to the second height $H_2$, that is, the second top surface 355 is the top surface of the lower part 352 of the border portion. The second top surface 355 has a second surface roughness. The first surface roughness is different from the second surface roughness.

Figure 7:
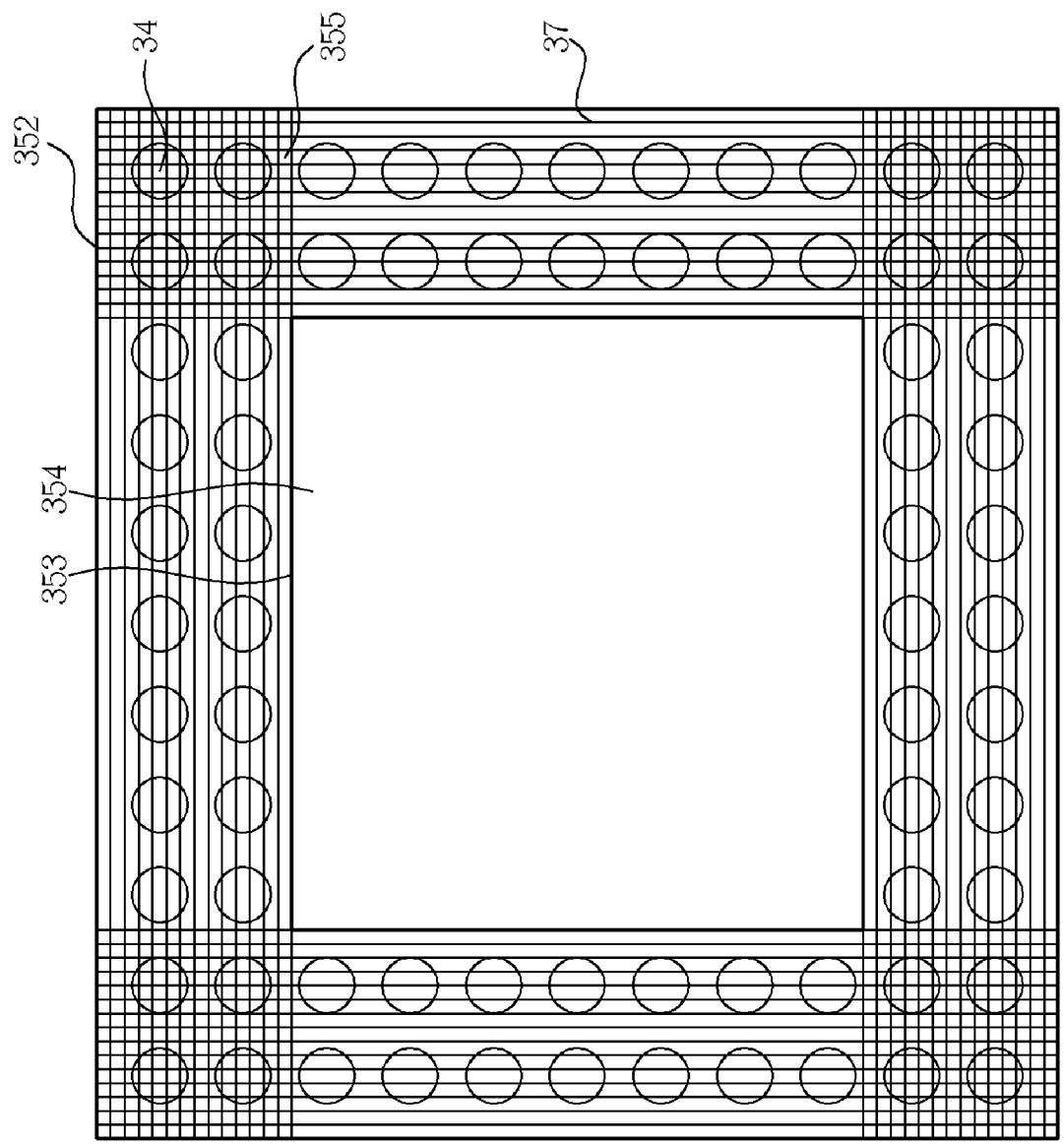

Please refer to FIG. 7 showing a top view of FIG. 6. The second top surface 355 is a cutting surface and has a plurality of cutting lines 37 after the cutting. In the embodiment, the upper parts of the first solder balls 34 are removed along with the removal of the upper part 351 of the border portion of the first molding compound 35. Therefore, only the lower parts of the first solder balls 34 are remained to form a hemispherical shape (as shown in FIG. 6). Furthermore, all the part of the molding compound 35 and the parts of the first solder balls 34 included in the second top surface 355 have the cutting lines 37. As shown in FIG. 7, the cutting lines 37 located at each of the four sides of the second top surface 355 are substantially parallel, and the cutting lines 37 located in each of the four corners of the second top surface 355 perpendicularly cross each other, since the four corners of the second top surface 355 are cut twice.

Please still refer to FIG. 6 showing a schematic diagram the first package of the present invention. The first package 3 comprises a first substrate 31, a first chip 32, a plurality of first connecting elements (such as a plurality of first conductive wires 33), a plurality of first conductive bodies (such as a plurality of first solder balls 34), a first molding compound 35, and a plurality of second solder balls 36. The first substrate 31 has a first surface 311, a second surface 312, a plurality of first pads 313 on the first surface 311, and a plurality of second pads 314 on the second surface 312. The first chip 32 is attached to the first surface 311 of the first substrate 31. In this embodiment, the first chip 32 is attached to the first surface 311 of the first substrate 31. The first conductive wires 33 electrically connect the first chip 32 and the first substrate 31. The first solder balls 34 are in a hemispherical shape and disposed on the first pads 313 of the first surface 311 of the first substrate 31. The second solder balls 36 are disposed on the second pads 314 of the second surface 312 of the first substrate 31.

The molding compound 35 encapsulates the first surface 311 of the first substrate 31, the first chip 32, the first conductive wires 33, and the first solder balls 34. The molding compound 35 has a first height $H_1$, a second height $H_2$, a central portion 353, a lower part 352 of a border portion, a first top surface 354, and a second top surface 355. The first height $H_1$ is the height of the central portion 353 corresponding to the positions of the first chip 32 and the first conductive wires 33. The second height $H_2$ is the height of the lower part 352 of the border portion corresponding to the positions of the first solder balls 34. The first height $H_1$ is greater than the second height $H_2$. The first top surface 354 is corresponding to the first height $H_1$, that is, the first top surface 354 is the top surface of the central portion 353. The first top surface 354 has a first surface roughness. The second top surface 355 is corresponding to the second height $H_2$, that is, the second top surface 355 is the top surface of the lower part 352 of the border portion. The second top surface 355 has a second surface roughness. The first surface roughness is different from the second surface roughness.

Please refer to FIG. 7. In this embodiment, the second top surface 355 is a cutting surface and has a plurality of cutting lines 37 after the cutting. Furthermore, all the part of the molding compound 35 and the parts of the first solder balls 34 included in the second top surface 355 have the cutting lines 37. As shown in FIG. 7, the cutting lines 37 located at each of the four sides of the second top surface 355 are parallel, and the cutting lines 37 located in each of the four corners of the second top surface 355 perpendicularly cross each other, since the four corners of the second top surface 355 are cut twice.

Figure 8:
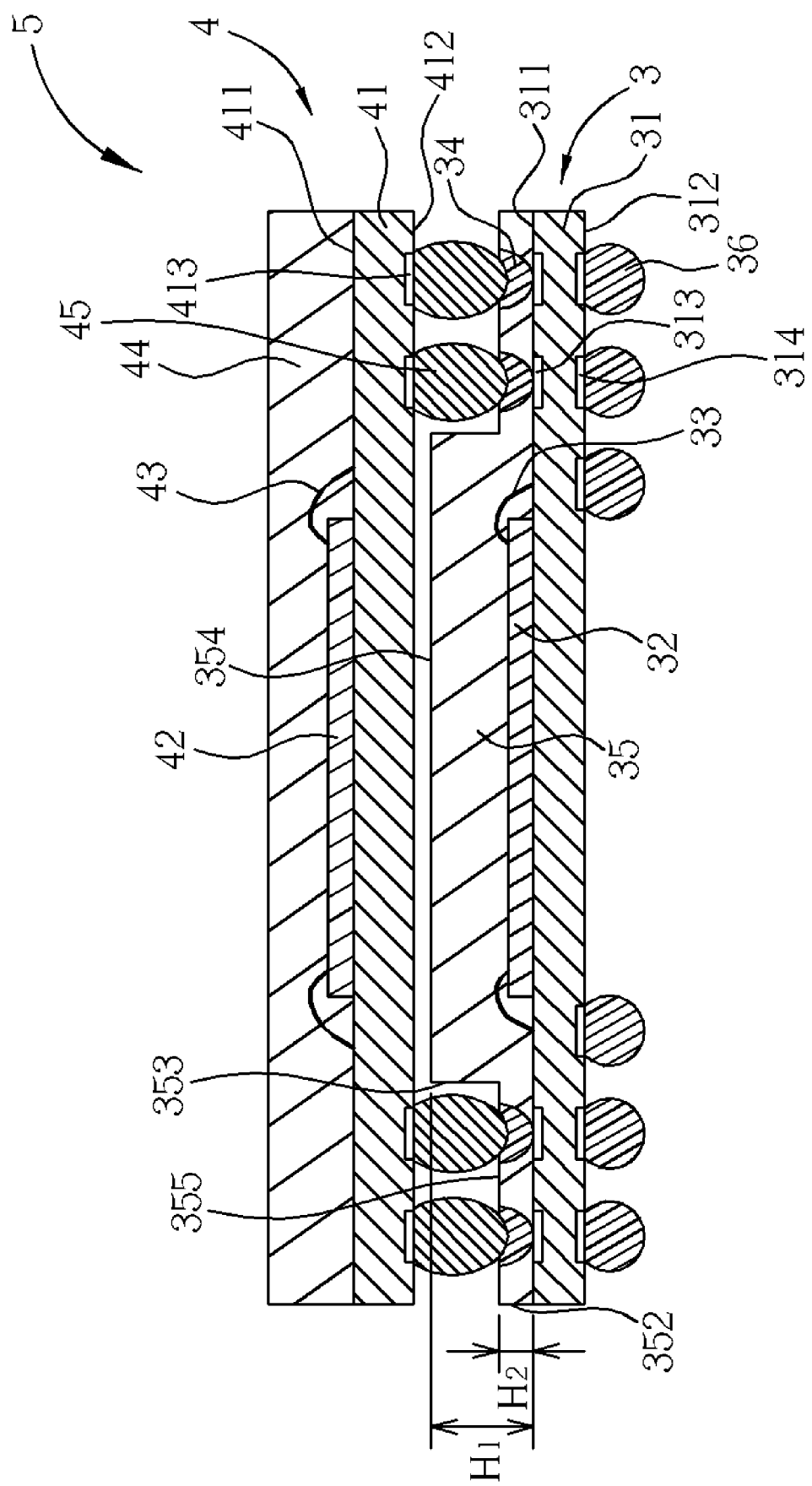

Please refer to FIG. 2 and FIG. 8. In Step S208, a second package 4 is stacked on the first solder balls 34 and electrically connected to the first solder balls 34, to make a semiconductor device 5. The second package 4 may be any kind of semiconductor packages. In this embodiment, the second package 4 comprises a second substrate 41, a second chip 42, a plurality of second conductive wires 43, a second molding compound 44, and a plurality of third solder balls 45. The second substrate 41 has a first surface 411 and a second surface 412. The second chip 42 is attached to the first surface 411 of the second substrate 41. The second conductive wires 43 electrically connect the second chip 42 and the second substrate 41. The second molding compound 44 encapsulates the first surface 411 of the second substrate 41, the second chip 42, and the second conductive wires 43. The third solder balls 45 are disposed on the second surface 412 of the second substrate 41 and electrically connected to the first solder balls 34.

In this embodiment, the size of the second molding compound 44 of the second package 4 is the same as that of the first molding compound 35 of the first package 3. Thus, only one molding machine is required to perform both the molding processes for the second package 4 and the first package 3. As a result, the production cost can be reduced. In addition, in the molding process for the first package 3, the first molding compound encapsulates the entire first surface 311 of the first substrate 31, and accordingly the pads on the first surface 311 are not polluted.

Please still refer to FIG. 8, showing a schematic diagram of the semiconductor device according to the present invention. The semiconductor device 5 comprises a first package 3 and a second package 4. The second package 4 is stacked on the first package 3. The first package 3 comprises a first substrate 31, a first chip 32, a plurality of first connecting elements (such as a plurality of first conductive wires 33), a plurality of first conductive bodies (such as a plurality of first solder balls 34), a first molding compound 35, and a plurality of second solder balls 36. The first substrate 31 has a first surface 311, a second surface 312, a plurality of first pads 313 on the first surface 311, and a plurality of second pads 314 on the second surface 312. The first chip 32 is attached to the first surface 311 of the first substrate 31. The first conductive wires 33 electrically connect the first chip 32 and the first substrate 31. The first solder balls 34 are in a hemispherical shape and disposed on the first pads 313 of the first surface 311 of the first substrate 31.

The molding compound 35 encapsulates the first surface 311 of the first substrate 31, the first chip 32, the first conductive wires 33, and the first solder balls 34. The molding compound 35 has a first height $H_1$, a second height $H_2$, a central portion 353, a lower part 352 of a border portion, a first top surface 354, and a second top surface 355. The first height $H_1$ is the height of the central portion 353 corresponding to the positions of the first chip 32 and the first conductive wires 33. The second height $H_2$ is the height of the lower part 352 of the border portion corresponding to the positions of the first solder balls 34. The first height $H_1$ is greater than the second height $H_2$. The first top surface 354 is corresponding to the first height $H_1$, that is, the first top surface 354 is the top surface of the central portion 353. The first top surface 354 has a first surface roughness. The second top surface 355 is corresponding to the second height $H_2$, that is, the second top surface 355 is the top surface of the lower part 352 of the border portion. The second top surface 355 has a second surface roughness. The first surface roughness is different from the second surface roughness.

Please also refer to FIG. 7. In this embodiment, the second top surface 355 is a cutting surface and has a plurality of cutting lines 37 after the cutting. Furthermore, all the part of the molding compound 35 and the parts of the first solder balls 34 included in the second top surface 355 have the cutting lines 37. As shown in FIG. 7, the cutting lines 37 located at each of the four sides of the second top surface 355 are parallel, and the cutting lines 37 located in each of the four corners of the second top surface 355 perpendicularly cross each other, since the four corners of the second top surface 355 are cut twice.

The second package 4 comprises a second substrate 41, a second chip 42, a plurality of second conductive wires 43, a second molding compound 44, and a plurality of third solder balls 45. The second substrate 41 has a first surface 411 and a second surface 412. The second chip 42 is attached to the first surface 411 of the second substrate 41. The second conductive wires 43 electrically connect the second chip 42 and the second substrate 41. The second molding compound 44 encapsulates the first surface 411 of the second substrate 41, the second chip 42, and the second conductive wires 43. The third solder balls 45 are disposed on the second surface 412 of the second substrate 41 and electrically connected to the first solder balls 34.

Those skilled in the art will readily observe that numerous modifications and alterations of the device and method may be made while retaining the teachings of the invention.

What is claimed is:

1. A method of making a semiconductor package, comprising steps of:

providing a first substrate having a first surface and a second surface;

attaching a first chip to the first surface of the first substrate;

forming a plurality of first connecting elements for electrically connecting the first chip and the first substrate;

forming a plurality of first conductive bodies on the first surface of the first substrate;

forming a first molding compound for encapsulating the first surface of the first substrate, the first chip, the first connecting elements, and the first conductive bodies; and removing a part of a border portion of the first molding compound and at least one half of at least one of the first conductive bodies, so that the first molding compound has a first top surface and a second top surface, the first top surface and the second top surface have different heights, and one end of each of the first conductive bodies is exposed.

2. The method of claim 1, wherein, in the step of forming a plurality of first conductive bodies on the first surface of the first substrate, the first conductive bodies comprise a plurality of first solder balls.

3. The method of claim 1, wherein, in the step of forming a first molding compound for encapsulating the first surface of the first substrate, the first chip, the first connecting elements, and the first conductive bodies, the first molding compound encapsulates the entire first surface of the first substrate.

4. The method of claim 1, wherein, in the step of removing a pan of a border portion of the first molding compound, further removing a pad of at least one of the first conductive bodies, such that at least one of the first conductive bodies is in a hemispherical shape.

5. The method of claim 1, wherein, the step of removing a pad of a border portion of the first molding compound is performed by laser cutting, chemical etching, cutting with a cutting tool or cutting with a water jet.

6. The method of claim 1, wherein, the step of removing a pad of a border portion of the first molding compound is performed by cutting with a cutting tool, thereby to form a plurality of cutting lines on the first molding compound.

7. The method of claim 1, wherein, after the step of forming a first molding compound for encapsulating the first surface of the first substrate, the first chip, the first connecting elements, and the first conductive bodies, further comprising a step of forming a plurality of second solder balls on the second surface of the first substrate.

8. The method of claim 1, further comprising a step of stacking a second package on the first conductive bodies and electrically connecting the second package to the first conductive bodies.

9. A method of making a semiconductor device, comprising steps of:
   providing a first substrate having a first surface and a second surface;
   forming a plurality of first conductive bodies on the first surface of the first substrate;
   attaching a first chip to the first surface of the first substrate;
   forming a first molding compound for encapsulating the first surface of the first substrate, the first chip, and the first conductive bodies; and
   removing a part of a border portion of the first molding compound, so that the first molding compound has a first top surface and a second top surface, the first top surface and the second top surface have different heights, the second to surface has a side portion and a corner portion, the side portion and the corner portion have different surface roughness, and one end of each of the first conductive bodies is exposed.

10. The method of claim 9, further comprising a step of stacking a second package on the first conductive bodies and electrically connecting the second package to the first conductive bodies.

11. The method of claim 9, wherein, in the step of forming a plurality of first conductive bodies on the first surface of the first substrate, the first conductive bodies comprise a plurality of first solder balls.

12. The method of claim 9, wherein, in the step of forming a first molding compound for encapsulating the first surface of the first substrate, the first chip, and the first conductive bodies, the first molding compound encapsulates the entire first surface of the first substrate.

13. The method of claim 9, wherein, in the step of removing a pan of a border portion of the first molding compound, further removing a part of at least one of the first conductive bodies such that at least one of the first conductive bodies is in a hemispherical shape.

14. The method of claim 9, wherein, the step of removing a part of a border portion of the first molding compound is performed by laser cutting, chemical etching, cutting with a cutting tool or cutting with a water jet.

15. The method of claim 9, wherein, the step of removing a part of a border portion of the first molding compound is performed by cutting with a cutting tool, thereby to form a plurality of cutting lines on the first molding compound.

16. The method of claim 9, wherein, after the step of forming a first molding compound for encapsulating the first surface of the first substrate, the first chip, and the first conductive bodies, further comprising a step of forming a plurality of second solder balls on the second surface of the first substrate.

17. The method of claim 1, wherein, in the step of removing a part of a border portion of the first molding compound, further removing at least one half of each of the first conductive bodies, such that each of the first conductive bodies is in a hemispherical shape.

18. The method of claim 1, wherein, in the step of removing a part of a border portion of the first molding compound, the first top surface is associated with a central portion of the first molding compound, the second top surface is associated with the border portion of the first molding compound, the first top surface has a first height relative to the first surface of the first substrate, the second top surface has a second height relative to the first surface of the first substrate, and the first height and the second height are different.

19. The method of claim 18, wherein the second height is no greater than one half of the first height.

20. The method of claim 18, wherein one end of each of the first conductive bodies is substantially co-planar with the second top surface.

21. The method of claim 1, wherein, in the step of removing a part of a border portion of the first molding compound, the second top surface has a side portion and a corner portion, the side portion and the corner portion have different surface roughness.

22. The method of claim 9, wherein, in the step of removing a part of a border portion of the first molding compound, further removing at least one half of each of the first conductive bodies, such that each of the first conductive bodies is in a hemispherical shape.

23. The method of claim 9, wherein, in the step of removing a pan of a border portion of the first molding compound, the first top surface is associated with a central portion of the first molding compound, the second top surface is associated with the border portion of the first molding compound, the first top surface has a first height relative to the first surface of the first substrate, the second top surface has a second height relative to the first surface of the first substrate, and the first height and the second height are different.

24. The method of claim 23, wherein the second height is no greater than one half of the first height.

25. The method of claim 23, wherein one aid of each of the first conductive bodies is substantially co-planar with the second top surface.

* * * * *